(12) United States Patent
Kojima et al.

(10) Patent No.: US 11,594,670 B2
(45) Date of Patent: Feb. 28, 2023

(54) MEMS DEVICE AND ELECTRONIC DEVICE

(71) Applicant: SEIKO EPSON CORPORATION, Tokyo (JP)

(72) Inventors: Chikara Kojima, Matsumoto (JP); Eiji Osawa, Chino (JP); Koji Ohashi, Matsumoto (JP); Kanechika Kiyose, Matsumoto (JP); Tomohiro Sayama, Matsumoto (JP); Hironori Suzuki, Chino (JP); Katsuhiro Imai, Minowa-machi (JP); Yasuyuki Matsumoto, Azumino (JP); Takahiro Kamijo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 415 days.

(21) Appl. No.: 16/823,449

(22) Filed: Mar. 19, 2020

(65) Prior Publication Data
US 2020/0303618 A1 Sep. 24, 2020

(30) Foreign Application Priority Data
Mar. 20, 2019 (JP) .............................. JP2019-052547

(51) Int. Cl.
| | | |
|---|---|---|
| *H01L 41/00* | (2013.01) | |
| *H01L 41/053* | (2006.01) | |
| *B06B 1/02* | (2006.01) | |
| *B06B 1/06* | (2006.01) | |
| *B81B 7/00* | (2006.01) | |
| *H01L 41/04* | (2006.01) | |
| *H01L 41/08* | (2006.01) | |

(52) U.S. Cl.
CPC ........ *H01L 41/0533* (2013.01); *B06B 1/0215* (2013.01); *B06B 1/0622* (2013.01); *B81B 7/0051* (2013.01); *B81B 7/0058* (2013.01); *H01L 41/042* (2013.01); *H01L 41/0825* (2013.01); *B81B 2201/0271* (2013.01); *B81B 2203/0127* (2013.01)

(58) Field of Classification Search
None
See application file for complete search history.

(56) References Cited

U.S. PATENT DOCUMENTS

| | | | |
|---|---|---|---|
| 2013/0020910 A1* | 1/2013 | Ogawa ................ | H01L 41/1136 216/13 |
| 2013/0285507 A1* | 10/2013 | Yamauchi ........... | H01L 41/1136 310/319 |

(Continued)

FOREIGN PATENT DOCUMENTS

| | | |
|---|---|---|
| JP | 2013-181788 A | 9/2013 |
| JP | 2018-098580 A | 6/2018 |
| WO | 2014/174729 A1 | 10/2014 |

*Primary Examiner* — Benjamin P Sandvik
(74) *Attorney, Agent, or Firm* — Oliff PLC

(57) ABSTRACT

An MEMS device includes: a first member; a second member forming a sealed space with the first member therebetween; and a third member disposed between the first member and the second member and joined to the first member and the second member, in which the third member has lower rigidity than rigidity of the first member and the second member, and the third member is provided with a communication portion that establishes communication between the sealed space and an external space.

7 Claims, 14 Drawing Sheets

(56) References Cited

U.S. PATENT DOCUMENTS

| | | | |
|---|---|---|---|
| 2015/0052715 A1* | 2/2015 | Takabe | B41J 2/1628 |
| | | | 29/25.35 |
| 2016/0027424 A1 | 1/2016 | Shimizu et al. | |
| 2018/0161816 A1 | 6/2018 | Kojima | |
| 2019/0265795 A1* | 8/2019 | Ishii | B06B 1/0603 |

\* cited by examiner

FIG. 4
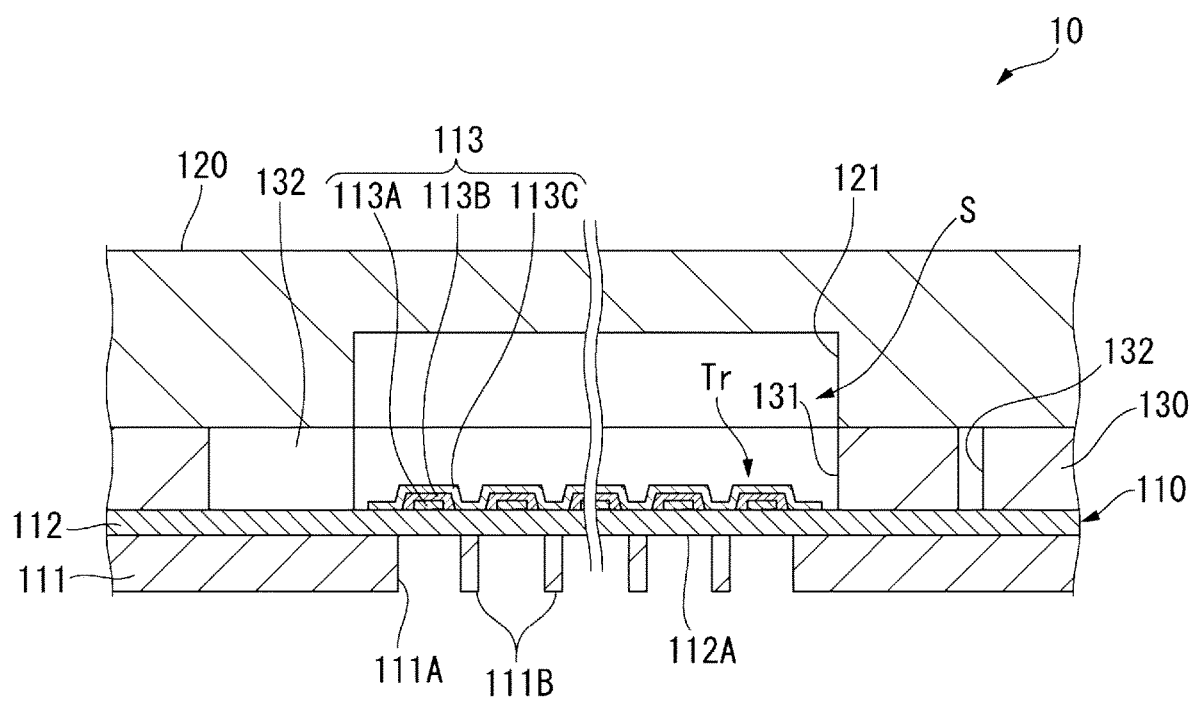
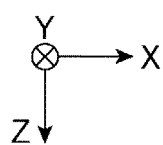

MEMS DEVICE AND ELECTRONIC DEVICE

The present application is based on, and claims priority from JP Application Serial Number 2019-052547, filed Mar. 20, 2019, the disclosure of which is hereby incorporated by reference herein in its entirety.

BACKGROUND

1. Technical Field

The present disclosure relates to a MEMS device and an electronic device.

2. Related Art

In the related art, a MEMs device provided with a space between a pair of substrates is known (see JP-A-2018-098580, for example).

JP-A-2018-098580 discloses an ultrasonic device that transmits and receives ultrasonic waves as the MEMS device. The ultrasonic device includes an element substrate provided with a plurality of ultrasonic transducers and a sealing plate joined to the element substrate. The element substrate has a substrate main body that has an opening, an oscillating film that covers the opening, and a piezoelectric element provided at a position corresponding to the oscillating film. Such an element substrate is weak against an external stress and there is a concern that the element substrate breaks due to the external stress. Meanwhile, it is possible to reinforce the element substrate by joining the sealing plate to the element substrate.

Also, a sealed space that allows driving of the ultrasonic transducers is formed between the sealing plate and the element substrate according to JP-A-2018-098580. There is a concern that if the sealed space is tightly closed, the ultrasonic transducers break due to a pressure difference between the sealed space and the external space. Therefore, a communication path that establishes communication between the sealed space and the external space is provided at the sealing plate such that no pressure difference is generated between the internal space and the external space in the ultrasonic device according to JP-A-2018-098580.

However, if the communication path is provided at the sealing plate, there is a concern that the strength of the sealing plate may be significantly degraded, and the sealing plate may break when an impact is imparted on the ultrasonic device. Also, if an opening end of the communication path of the sealing plate is caused to face the element substrate and is caused to abut on the element substrate, there is a concern that a stress applied from the outside may concentrate on the vicinity of the opening end of the communication path, and the element substrate that is in contact with the vicinity of the opening end of the communication path may be broken.

Note that the aforementioned problem is a common problem of various MEMS devices in which a first member that is likely to be broken is reinforced with a second member for reinforcement and a sealed space is formed between the first member and the second member and electronic devices provided with such MEMS devices.

An example of a MEMS device in which a reinforcing plate as a second member is joined to a substrate as a first member provided with a drive element such as an electrostatic actuator for reinforcement will be described. In such a MEMS device, there is a case in which a driving space for driving the drive element is provided between the substrate and the reinforcing plate. At this time, if a communication path that establishes communication between the driving space and the external space is provided at the reinforcing plate, there is a concern that the strength of the reinforcing plate may be significantly degraded and the substrate or the reinforcing plate may be broken similarly to the above description.

SUMMARY

A MEMS device according to a first application example includes: a first member; a second member forming a sealed space with the first member therebetween; and a third member disposed between the first member and the second member and joined to the first member and the second member, in which the third member has lower rigidity than rigidity of the first member and the second member, and the third member is provided with a communication portion that establishes communication between the sealed space and an external space.

In the MEMS device according to the application example, the first member and the third member may be joined with a viscoelastic member, and the second member and the third member may be joined with a viscoelastic member.

In the MEMS device according to the application example, the third member may have viscoelasticity and may be joined to the first member and the second member.

In the MEMS device according to the application example, the third member may be a resist resin.

In the MEMS device according to the application example, the first member may be a substrate including an oscillating portion and performing at least either transmission or reception of ultrasonic waves through oscillation of the oscillating portion, and the second member may be a reinforcing plate reinforcing the substrate.

In the MEMS device according to the application example, the third member is provided to surround a circumference of the oscillating portion, and the communication portion is disposed along an outer circumference of the oscillating portion.

An electronic device according to a second application example includes: the MEMS device according to the first application example; and a control unit controlling the MEMS device.

BRIEF DESCRIPTION OF THE DRAWINGS

FIG. 4 is a sectional view when the ultrasonic device is cut along the line IV-IV in FIG. 2.

DESCRIPTION OF EXEMPLARY EMBODIMENTS

First Embodiment

Hereinafter, a first embodiment will be described.

Figure 1:
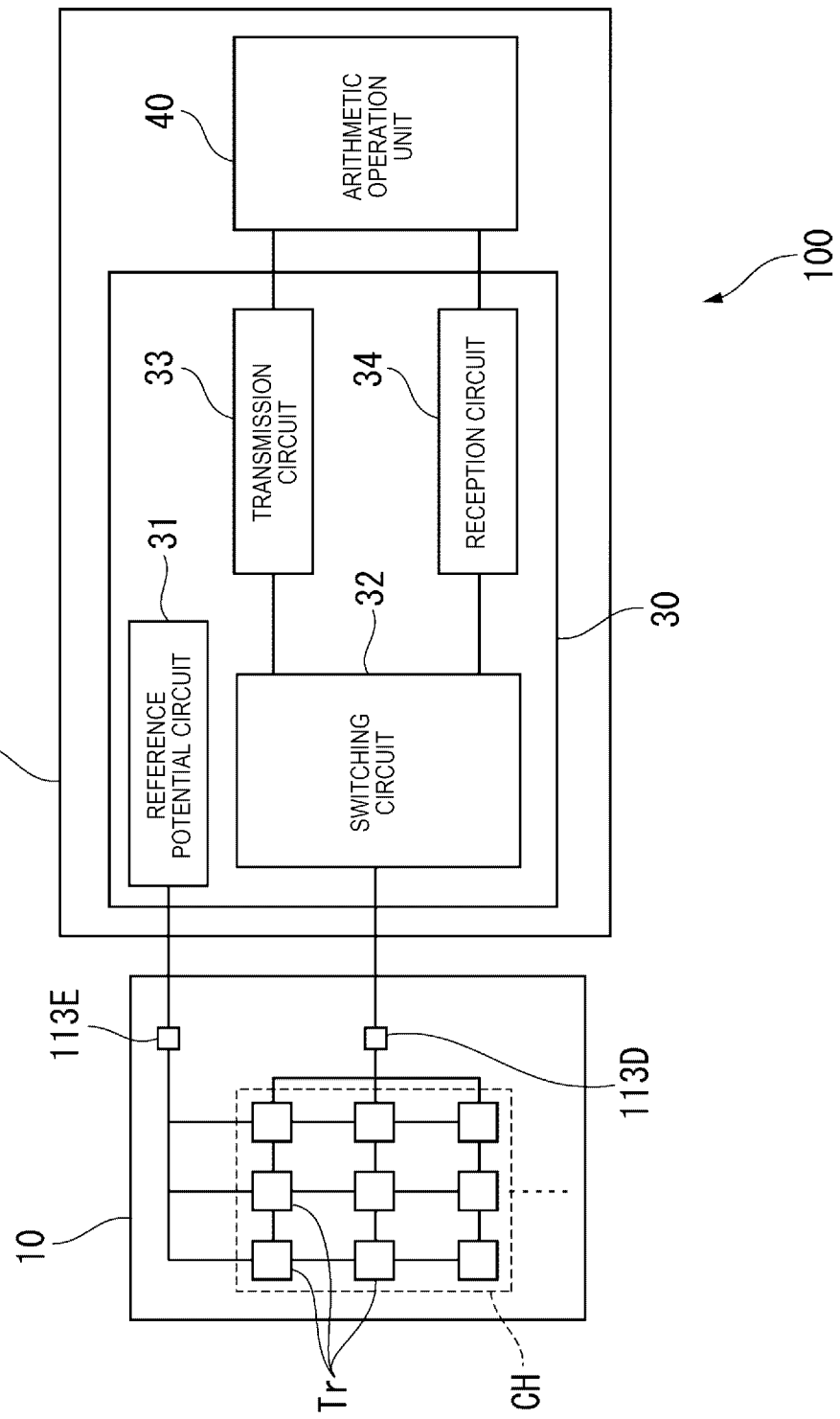
FIG. 1 is a block diagram illustrating an outline configuration of an ultrasonic apparatus according to a first embodiment.

FIG. 1 is a block diagram illustrating an outline configuration of an ultrasonic apparatus 100 according to the embodiment.

The ultrasonic apparatus 100 according to the embodiment is an electronic device provided with an ultrasonic device 10 that is a MEMS device. The ultrasonic apparatus 100 includes the ultrasonic device 10 and a control unit 20 that controls the ultrasonic device 10 as illustrated in FIG. 1.

In the ultrasonic apparatus 100 according to the embodiment, the control unit 20 controls the ultrasonic device 10, and the ultrasonic device 10 transmits ultrasonic waves. If ultrasonic waves are reflected by an object and the ultrasonic device 10 receives reflected waves, then the control unit 20 calculates the distance from the ultrasonic device 10 to the object on the basis of a time from an ultrasonic wave transmission timing to an ultrasonic wave reception timing.

Hereinafter, a configuration of such an ultrasonic apparatus 100 will be specifically described.

Configuration of Ultrasonic Device 10

Figure 2:
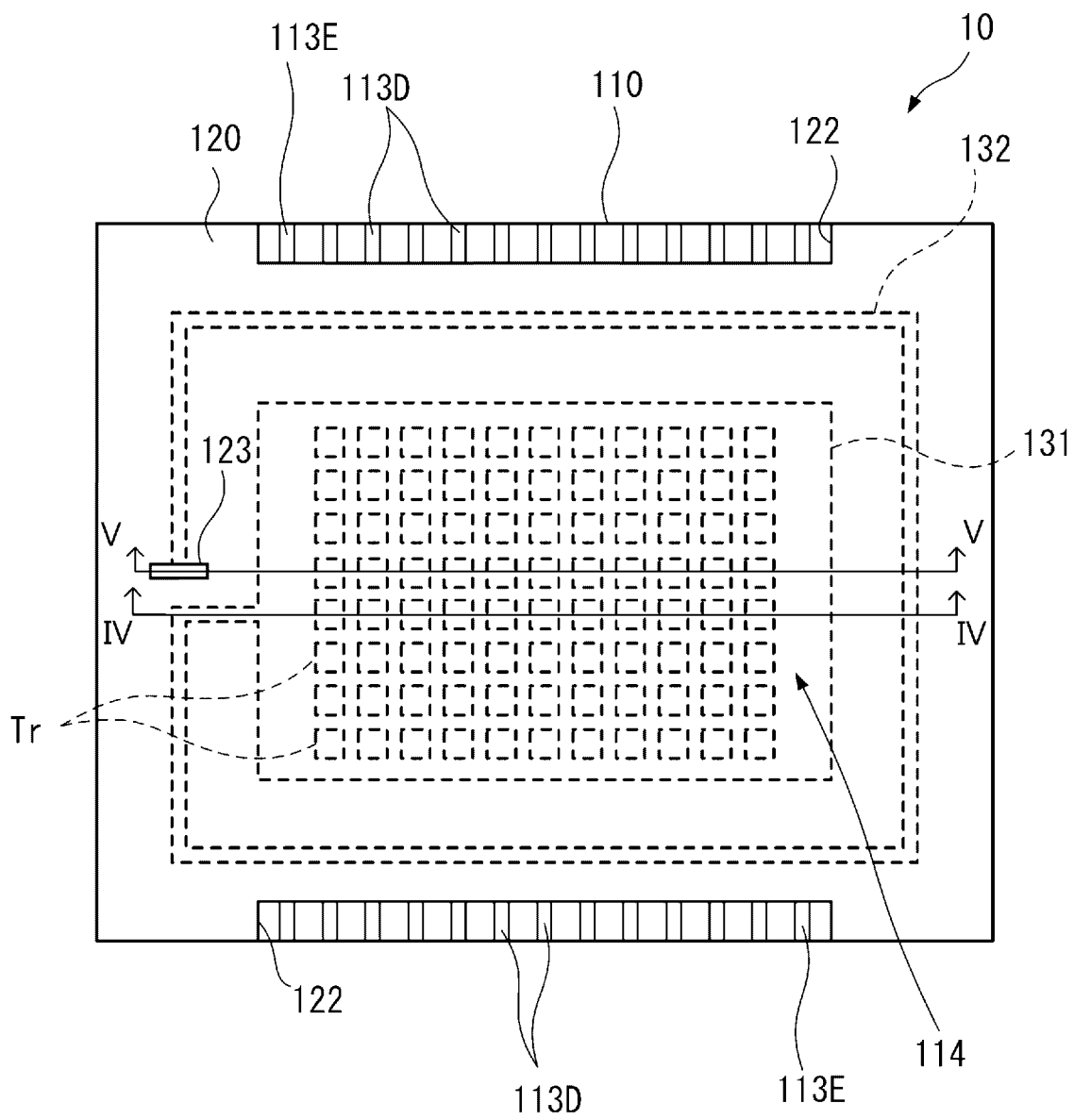
FIG. 2 is an outline plan view illustrating an ultrasonic device according to the first embodiment.
Figure 3:
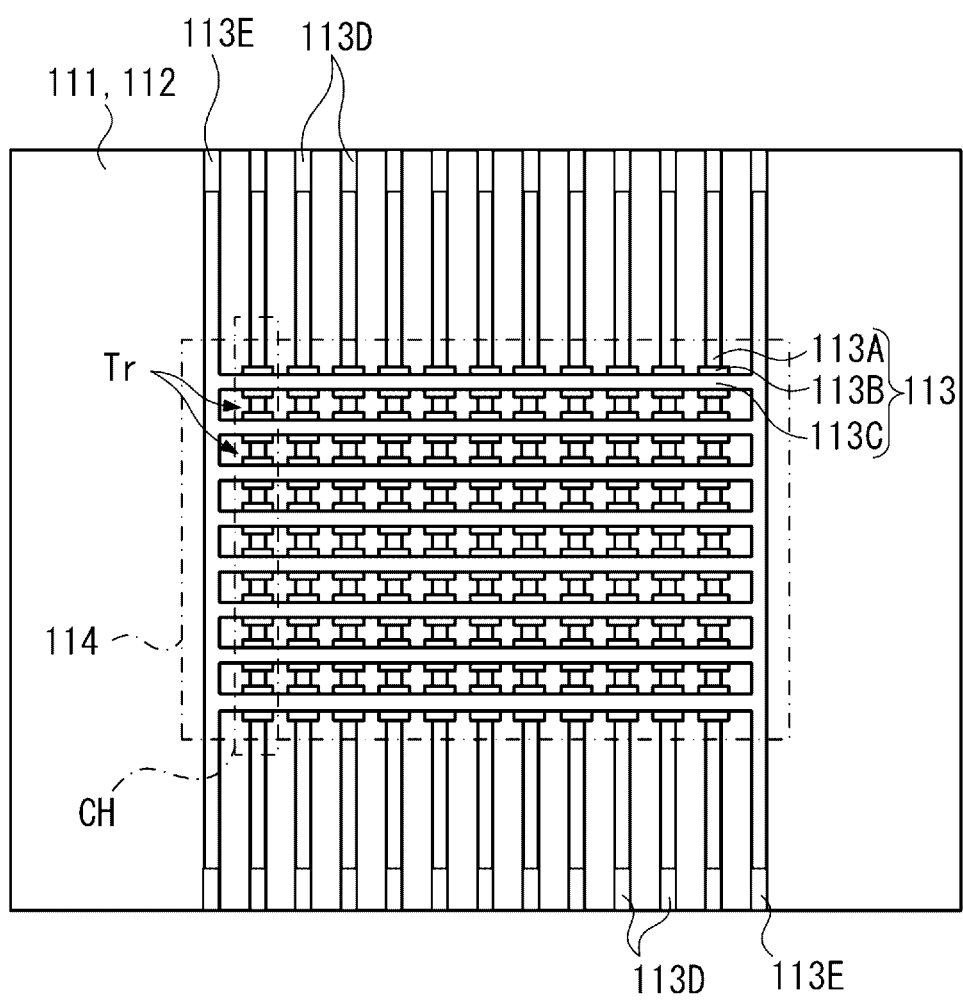
FIG. 3 is an outline plan view illustrating an ultrasonic substrate in the ultrasonic device according to the first embodiment.

FIG. 2 is an outline plan view illustrating an ultrasonic device 10. FIG. 3 is an outline plan view illustrating an ultrasonic substrate 110 of the ultrasonic device 10. FIG. 4 is a sectional view when the ultrasonic device 10 is cut along the line IV-IV in FIG. 2, and FIG. 5 is a sectional view when the ultrasonic device 10 is cut along the line V-V in FIG. 2.

Figure 5:
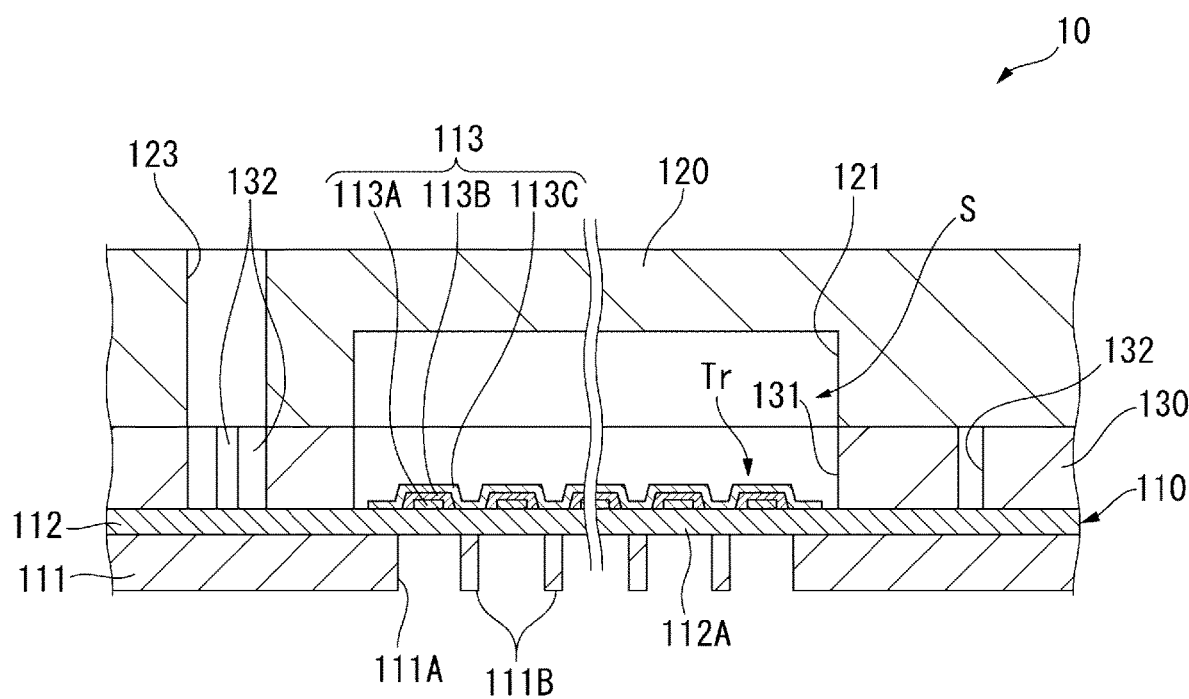
FIG. 5 is a sectional view when the ultrasonic device is cut along the line V-V in FIG. 2.

The ultrasonic device 10 includes the ultrasonic substrate 110 as a first member, a sealing plate 120 as a second member, and a joining layer 130 as a third member and is configured by the ultrasonic substrate 110 and the sealing plate 120 being joined with the joining layer 130, as illustrated in FIGS. 4 and 5.

Note that in the following description, the direction from the sealing plate 120 to the ultrasonic substrate 110 is defined as a direction Z, the direction that perpendicularly intersects the direction Z is defined as a direction X, and the direction that perpendicularly intersects the direction Z and the direction X is defined as a direction Y. In regard to the direction X, the direction Y, and the direction Z, a case that does not include any orientation may also be referred to as the directions.

Configuration of Ultrasonic Substrate 110

The ultrasonic substrate 110 is configured to include a substrate main body 111, an oscillating plate 112, and piezoelectric elements 113 as illustrated in FIGS. 4 and 5.

The substrate main body 111 is a substrate that is configured of a semiconductor substrate of Si or the like and that has a predetermined thickness for supporting the oscillating plate 112.

In the substrate main body 111, a plurality of holes 111A disposed in a two-dimensional array shape along the direction X and the direction Y are provided. These holes 111A are through-holes that penetrate the substrate main body 111 in the direction Z. Also, the oscillating plate 112 is provided on the −Z side of the substrate main body 111, and opening ends of the holes 111A on the −Z side are blocked with the oscillating plate 112. In other words, a portion of the substrate main body 111 in which no holes 111A are provided configures a wall 111B, and the oscillating plate 112 is disposed on the wall 111B.

The oscillating plate 112 is provided on the −Z side of the substrate main body 111 as described above. The thickness dimension of the oscillating plate 112 is a thickness dimension that is sufficiently thin with respect to the substrate main body 111. Here, a portion of the oscillating plate 112 that blocks the holes 111A configures blocking portions 112A, and the blocking portions 112A and the piezoelectric elements 113 configure ultrasonic transducers Tr.

The piezoelectric elements 113 are disposed on the −Z side of the respective blocking portions 112A. The piezoelectric elements 113 are configured by laminating first electrodes 113A, piezoelectric films 113B, and second electrodes 113C in order as illustrated in FIGS. 4 and 5. Note that other film layers may be provided between the piezoelectric elements 113 and the oscillating plate 112.

The piezoelectric elements 113 expand and contract by a voltage being applied between the first electrodes 113A and the second electrodes 113C. By the piezoelectric elements 113 expanding and contracting, the blocking portions 112A of the oscillating plate 112 with the piezoelectric elements 113 provided thereon oscillate, and ultrasonic waves are transmitted from the ultrasonic transducers Tr.

Also, if ultrasonic waves are input from the holes 111A to the blocking portions 112A, then the blocking portions 112A oscillate, and a potential difference is generated above and below the piezoelectric films 113B of the piezoelectric element 113. Therefore, it is possible to detect reception of ultrasonic waves by detecting the potential difference generated between the first electrodes 113A and the second electrodes 113C.

In the ultrasonic substrate 110 as described above, the plurality of ultrasonic transducers Tr are disposed in an array shape along the direction X and the direction Y as illustrated in FIG. 3. Also, a region on the ultrasonic substrate 110 in which the plurality of ultrasonic transducers Tr are disposed, that is, the region surrounded by the one-dotted dashed line illustrated in FIG. 3 will be referred to as an oscillating portion 114 in the following description.

In the embodiment, the first electrodes 113A are linearly formed in the direction Y and are coupled to drive terminals 113D provided at ±Y ends. In other words, the first electrodes 113A are commonly used by the ultrasonic transducers Tr that are adjacent in the direction Y to form one channel CH. A plurality of channels CH are disposed in the direction X. Therefore, it is possible to input respectively independent drive signals to the drive terminals 113D corresponding to the respective channels CH, and the respective channels CH can be individually driven.

Meanwhile, the second electrodes 113C are linearly formed in the direction X, and ±X-side ends of the respective second electrodes 113C are coupled to each other and are then coupled to a common terminal 113E, as illustrated in FIG. 3. These second electrodes 113C are electrically coupled to a drive circuit 30 via the common terminal 113E, and the same common potential is applied thereto.

Configuration of Sealing Plate 120

The sealing plate 120 is a reinforcing plate that reinforces the ultrasonic substrate 110 and configures the second member according to the disclosure. The sealing plate 120 is configured to have substantially the same size and the same shape as those of the ultrasonic substrate 110 in a plan view when seen in the direction Z as illustrated in FIG. 2.

As illustrated in FIGS. 4 and 5, a recessed portion 121 is provided at a portion of a +Z-side surface of the sealing plate 120 that faces the oscillating portion 114 of the ultrasonic substrate 110. A sealed space S sandwiched by the recessed portion 121 of the sealing plate 120, the ultrasonic substrate 110, and an opening 131 of the joining layer 130, which will be described later, is a space that allows oscillation of the blocking portions 112A of the respective ultrasonic transducers Tr.

The depth of the recessed portion 121 that forms the sealed space S is set in accordance with wavelength of the ultrasonic waves output from the ultrasonic substrate 110. Specifically, the distance from the ultrasonic substrate 110 to a bottom surface of the recessed portion 121 is preferably set to be an odd-multiply of $\lambda/4$ on the assumption that the wavelength of the ultrasonic waves is $\lambda$. In other words, although the ultrasonic waves are transmitted on the +Z side from the ultrasonic substrate 110 in the embodiment, the ultrasonic waves (back waves) is also fed to the −Z side of the blocking portions 112A if the ultrasonic transducers Tr are driven. Here, it is possible to cause phases of the back waves reflected by the bottom surface of the recessed portion 121 and the ultrasonic waves fed from the ultrasonic transducers Tr to the +Z side to deviate from each other and to attenuate the ultrasonic waves by the depth of the recessed portion 121 being set as described above.

Note that although the depth of the recessed portion 121 is set as described above in order to calculate the distance from the ultrasonic device 10 to the object on the basis of a time from the ultrasonic transmission timing to the reception timing when the ultrasonic waves reflected by the object are received in the ultrasonic apparatus 100 according to the embodiment, the depth of the recessed portion 121 may appropriately be set in accordance with a purpose of the measurement of the ultrasonic waves. When the ultrasonic waves are transmitted to the object and a sound pressure of the ultrasonic waves penetrating through the object is measured to detect the thickness of the object, for example, it is necessary to raise the sound pressure of the ultrasonic waves to be transmitted. In this case, the ultrasonic waves to be transmitted may be amplified by setting the distance from the ultrasonic substrate 110 to the bottom surface of the recessed portion 121 to be an odd multiple of $\lambda/4$.

Although the recessed portion 121 is formed in the sealing plate 120 in order to form the sealed space S in the embodiment, a configuration in which the recessed portion 121 is not provided may also be employed. Although details will be described later, the joining layer 130 with a predetermined thickness is provided between the ultrasonic substrate 110 and the sealing plate 120 in the embodiment. When the thickness of the joining layer 130 is sufficiently thick, and it is possible to form the sealed space S in which the ultrasonic transducers Tr can sufficiently be driven, a configuration in which the recessed portion 121 is not provided may also be employed. In other words, a configuration in which the sealed space S may be formed between the ultrasonic substrate 110 and the sealing plate 120 using the thickness of the joining layer 130 may also be employed.

At a portion of a peripheral edge of the sealing plate 120 according to the embodiment that faces the drive terminals 113D and the common terminal 113E provided at the ultrasonic substrate 110 in the peripheral edge of the sealing plate 120 in a plan view when seen in the direction Z, a notch 122 is provided. The notch 122 enables a configuration in which the drive terminals 113D and the common terminal 113E are exposed and makes it possible to easily couple signal lines to the ultrasonic substrate 110.

Further, a communication hole 123 is provided in the sealing plate 120 at a position separated from a region overlapping with the oscillating portion 114 by a predetermined dimension in a plan view when seen in the direction Z. The communication hole 123 is a through-hole that penetrates the sealing plate 120 in the direction Z. Although details will be described later, the communication hole 123 communicates with a flow path groove 132 formed in the joining layer 130 as illustrated in FIGS. 2 and 5.

Configuration of Joining Layer 130

Figure 6:
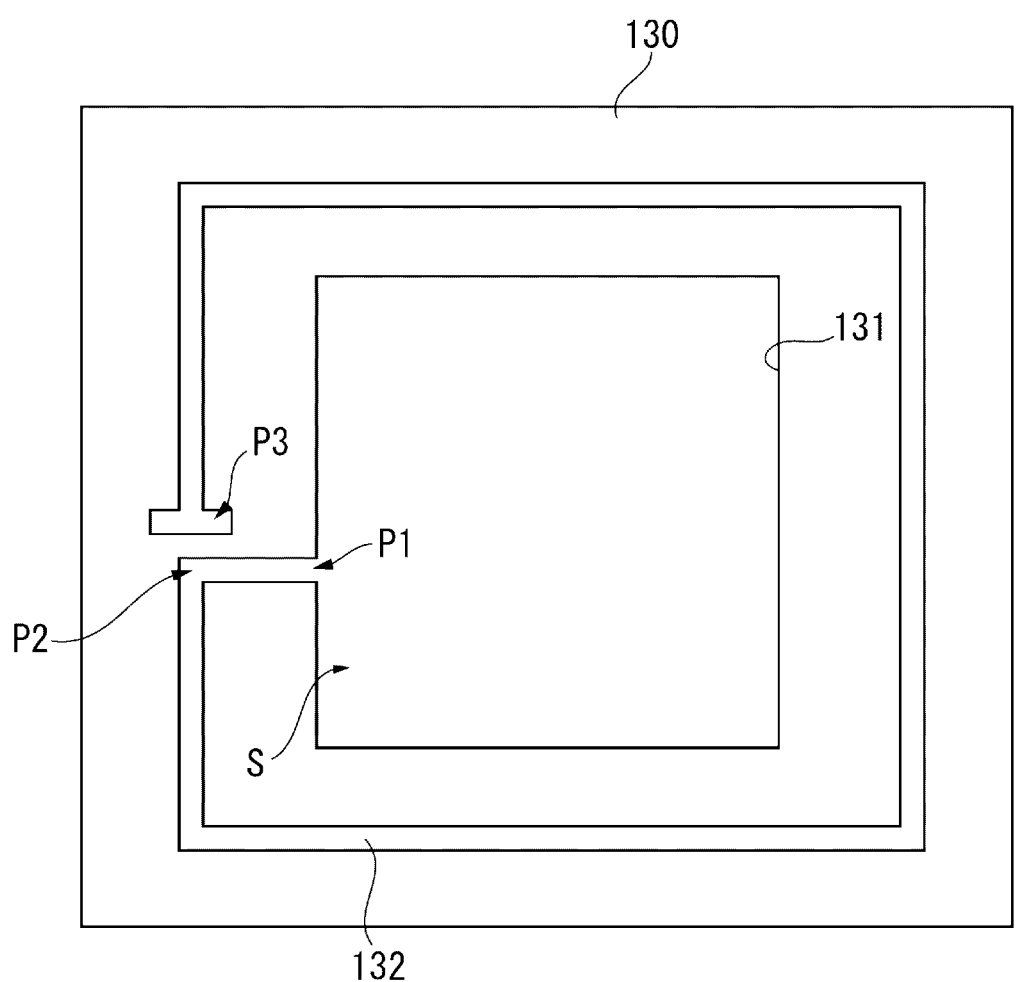
FIG. 6 is an outline plan view of a joining layer according to the first embodiment.

FIG. 6 is a plan view when the joining layer 130 according to the embodiment is seen in the direction Z.

The joining layer 130 is configured of a material that has lower rigidity than that of the ultrasonic substrate 110 and has lower rigidity than that of the sealing plate 120. In the embodiment, the joining layer 130 is formed of a resist resin with viscoelasticity. Accordingly, the +Z-side surface of the joining layer 130 is joined to the ultrasonic substrate 110 with viscosity of the joining layer 130, and the −Z-side surface of the joining layer 130 is joined to the sealing plate 120 with the viscosity of the joining layer 130 as illustrated in FIGS. 4 and 5. In other words, the ultrasonic substrate 110 and the sealing plate 120 are joined with the joining layer 130.

The joining layer 130 is not formed at a position overlapping with the oscillating portion 114 of the ultrasonic substrate 110 and is provided to surround the circumference of the region (sealed space S) overlapping with the oscillating portion 114 in a plan view when seen in the direction Z as illustrated in FIGS. 2, 4, and 5. In other words, the opening 131 that forms a part of the sealed space S is provided in the joining layer 130 at a position that overlaps with the oscillating portion 114 in a plan view when seen in the direction Z.

Also, the flow path groove 132 is formed in the joining layer 130 as illustrated in FIG. 6. The flow path groove 132 is a groove penetrating from the surface of the joining layer 130 on the side of the ultrasonic substrate 110 to the surface of the joining layer 130 on the side of the sealing plate 120 as illustrated in FIG. 4 or 5. One end P1 of the flow path groove 132 is coupled to the opening 131 and communicates with the sealed space S in a plan view when seen in the direction Z. The other end P3 of the flow path groove 132 is provided at a position facing the communication hole 123 provided in the sealing plate 120 and is coupled to the communication hole 123. In other words, the flow path groove 132 configures a communication portion that couples the sealed space S to the communication hole 123 that communicates with the external space and that causes the sealed space S to communicate with the external space.

More specifically, in a plan view when seen in the direction Z, the flow path groove 132 extends from the one end P1 coupled to the opening 131 to the position P2 located further outward than the peripheral edge of the opening 131 by a predetermined distance, is further turned substantially all around the opening 131 along the peripheral edge of the opening 131 from the position P2, and extends up to the other end P3 facing the communication hole 123, as illustrated in FIG. 6. In other words, the flow path groove 132 is disposed to surround the peripheral edge of the oscillating portion 114 when the ultrasonic device 10 is seen in the direction Z.

The joining layer 130 provided with such a flow path groove 132 can easily be formed using an elastomer such as a resist resin, for example. When a positive photoresist is used, for example, it is possible to form the joining layer 130 by forming the positive photoresist on the oscillating plate 112 of the ultrasonic substrate 110 and irradiating formation positions of the opening 131 and the flow path groove 132 with light with a predetermined wavelength using a laser light source or the like to remove the positive photoresist.

Configuration of Control Unit 20

Returning to FIG. 1, the control unit 20 will be described.

The control unit 20 is configured to include a drive circuit 30 that drives the ultrasonic device 10 and an arithmetic operation unit 40. Also, the control unit 20 may include a store unit that stores various kinds of data, various programs, and the like for controlling the ultrasonic apparatus 100 in addition thereto.

The drive circuit 30 is a driver circuit for controlling the driving of the ultrasonic device 10 and includes, for example, a reference potential circuit 31, a switching circuit 32, a transmission circuit 33, a reception circuit 34, and the like as illustrated in FIG. 1.

The reference potential circuit 31 is coupled to the common terminal 113E of the second electrodes 113C in the ultrasonic device 10 and applies a reference potential to the second electrodes 113C.

The switching circuit 32 is coupled to the drive terminal 113D, the transmission circuit 33, and the reception circuit 34. The switching circuit 32 is configured of a switching circuit that switches transmission connection for coupling the respective drive terminals 113D to the transmission circuit 33 and reception connection for coupling the respective drive terminals 113D to the reception circuit 34.

The transmission circuit 33 is coupled to the switching circuit 32 and the arithmetic operation unit 40. In addition, the transmission circuit 33 outputs a drive signal with a pulse waveform to the respective ultrasonic transducers Tr and causes the ultrasonic device 10 to transmit ultrasonic waves on the basis of control performed by the arithmetic operation unit 40 when the switching circuit 32 is switched to the transmission connection.

The arithmetic operation unit 40 is configured of a central processing unit (CPU), for example, controls the ultrasonic device 10 via the drive circuit 30, and causes the ultrasonic device 10 to perform processing of transmitting and receiving ultrasonic waves.

In other words, the arithmetic operation unit 40 switches the switching circuit 32 to the transmission connection, causes the transmission circuit 33 to drive the ultrasonic device 10, and to perform processing of transmitting ultrasonic waves. Also, the arithmetic operation unit 40 causes the switching circuit 32 to switch to the reception connection and causes the ultrasonic device 10 to receive reflected waves reflected by the object immediately after the ultrasonic waves are transmitted. Also, the arithmetic operation unit 40 calculates the distance from the ultrasonic device 10 to the object by a time-of-flight (ToF) method using a time from the transmission timing at which the ultrasonic waves are transmitted from the ultrasonic device 10 to the reception of the reception signal.

Effects and Advantages of Embodiment

The ultrasonic apparatus 100 according to the embodiment includes the ultrasonic device 10 and the control unit 20 that controls the ultrasonic device 10. Also, the ultrasonic device 10 includes the ultrasonic substrate 110, the sealing plate 120 that forms the sealed space S with the ultrasonic substrate 110, and the joining layer 130 disposed between the ultrasonic substrate 110 and the sealing plate 120 and joined to the ultrasonic substrate 110 and the sealing plate 120. In addition, the joining layer 130 has lower rigidity than that of the ultrasonic substrate 110 and the sealing plate 120, and the joining layer 130 is provided with the flow path groove 132 that establishes communication between the sealed space S and the external space.

Therefore, since no communication portion is provided at the sealing plate 120, the strength of the sealing plate 120 is enhanced, and the sealing plate 120 is unlikely to be broken even if a stress is applied thereto due to an impact or the like in the embodiment. Therefore, it is possible to curb invasion of moisture or the like due to breakage of the sealing plate 120 and degradation of performance of the ultrasonic transducers Tr due to the invading moisture or the like.

Also, when the sealing plate with the recessed groove opened on the side of the ultrasonic substrate is caused to abut on the ultrasonic substrate as in the related art, there is a concern that the stress may concentrate on the vicinity of the opening end of the recessed groove and the ultrasonic substrate may be broken if a stress is applied thereto. Meanwhile, according to the embodiment, the flow path groove 132 is provided in the joining layer 130 with lower rigidity than that of the ultrasonic substrate 110 and the sealing plate 120. In this case, even when the stress concentrates along the opening end of the flow path groove 132 in the joining layer 130, the stress is absorbed by the joining layer 130. Accordingly, it is possible to curb breakage of the ultrasonic substrate 110 and the sealing plate 120.

In the embodiment, the joining layer 130 has viscoelasticity and is joined to the ultrasonic substrate 110 and the sealing plate 120.

In this case, it is not necessary to use other joining materials to perform joining between the joining layer 130 and the ultrasonic substrate 110 and between the joining layer 130 and the sealing plate 120. In this manner, it is possible to simplify the configuration.

In the embodiment, the joining layer 130 is configured of a resist resin.

The resist resin can easily be patterned into a desired shape through etching or the like and has manufacturing efficiency. Accordingly, it is possible to highly precisely form the space for forming the sealed space S and the flow path groove 132.

The ultrasonic substrate 110 according to the embodiment is a substrate that includes the oscillating portion 114 and performs transmission and reception of ultrasonic waves through oscillation of the blocking portions 112A of the ultrasonic transducers Tr provided at the oscillating portion 114, and the sealing plate 120 is a reinforcing plate that reinforces the ultrasonic substrate 110.

For the ultrasonic device 10 that causes the blocking portions 112A of the oscillating portion 114 to oscillate and transmit ultrasonic waves as in the embodiment, it is necessary to thin the thickness of the blocking portions 112A in order to increase oscillation displacement of the blocking portions 112A with reduced electric power. In this case, the ultrasonic substrate 110 has low rigidity and is likely to be broken. Meanwhile, it is possible to reinforce the ultrasonic substrate 110 and to more suitably curb breakage of the ultrasonic substrate 110 by joining the sealing plate 120 in the embodiment.

In the embodiment, the joining layer 130 is provided to surround the circumference of the oscillating portion 114, and the flow path groove 132 is disposed along the outer circumference of the oscillating portion 114.

With such a configuration, the flow path length of the flow path groove 132 increases as compared with a configuration in which a linear groove is provided from the sealed space S to the communication hole 123. Therefore, even if foreign matters such as moisture enters from the communication hole 123, the foreign matters are unlikely to reach the inside of the sealed space S, and it is possible to protect the respective piezoelectric elements 113 disposed in the sealed space S from the foreign matters.

Second Embodiment

Next, a second embodiment will be described.

In the aforementioned first embodiment, the ultrasonic substrate 110 and the sealing plate 120 are joined to each other with the joining layer 130 that is the third member. Meanwhile, the second embodiment is different from the aforementioned first embodiment in that the third member disposed between the ultrasonic substrate 110 as the first member and the sealing plate 120 as the second member does not have viscosity to such an extent that sufficient joining strength is obtained.

Note that the same reference numerals will be applied to matters that have already been described, and description thereof will be omitted or simplified in the following description.

Figure 7:
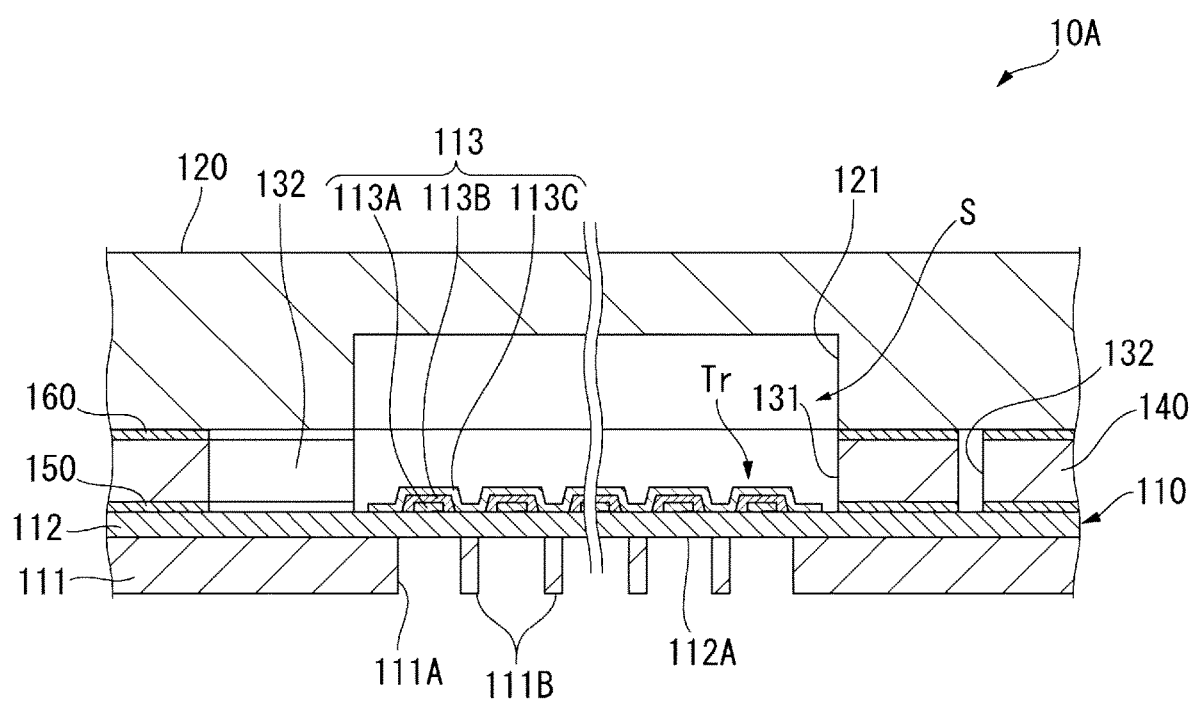
FIG. 7 is an outline sectional view illustrating an ultrasonic device according to a second embodiment.
Figure 8:
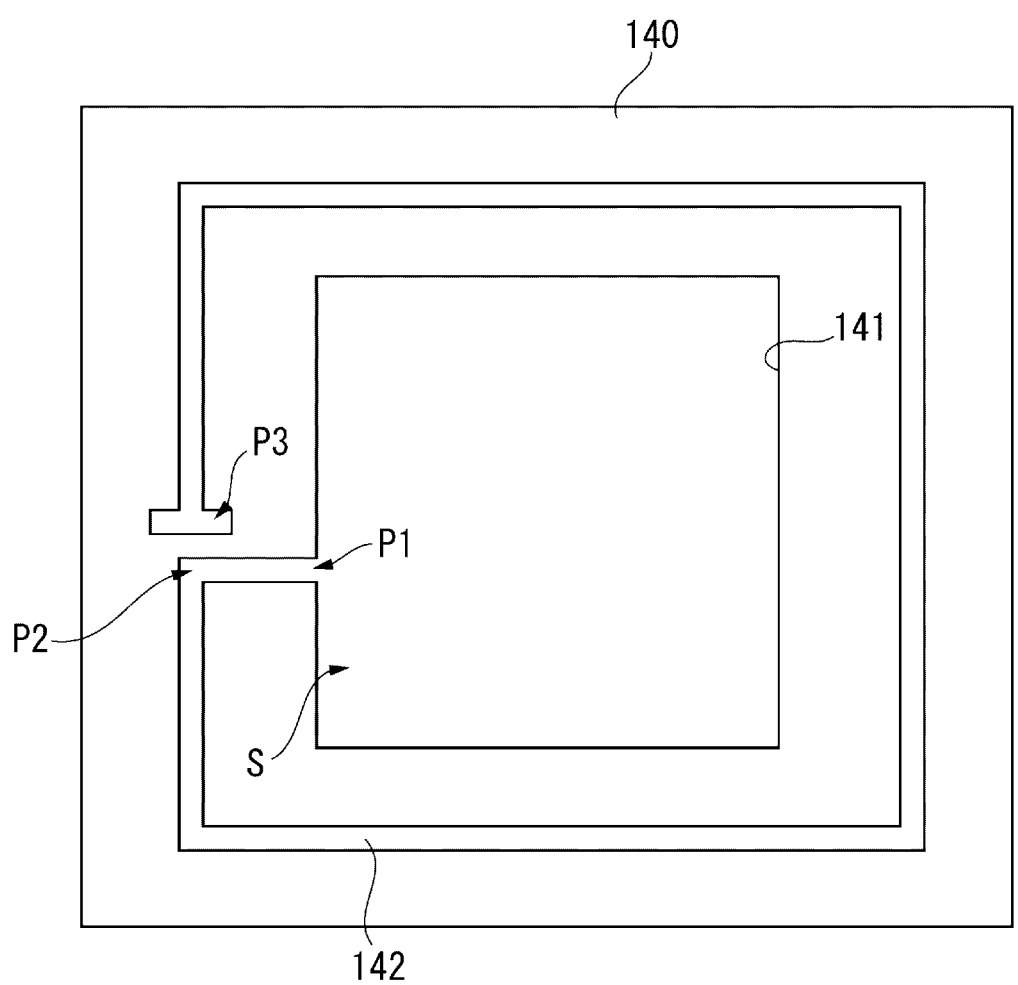
FIG. 8 is an outline plan view of an intermediate member according to the second embodiment.

FIG. 7 is an outline sectional view of an ultrasonic device 10A according to the second embodiment. FIG. 8 is an outline plan view of an intermediate member 140 that configures the ultrasonic device 10A. Note that the sectional view illustrating in FIG. 7 is a sectional view corresponding to the straight line connecting P1-P2 in FIG. 8.

In the embodiment, the ultrasonic device 10A includes an ultrasonic substrate 110 and a sealing plate 120, and the intermediate member 140 as a third member is provided between the ultrasonic substrate 110 and the sealing plate 120. The intermediate member 140 is configured of an elastic body with lower rigidity than that of the ultrasonic substrate 110 and the sealing plate 120 and is configured of an elastomer, for example.

The shape of the intermediate member 140 is similar to that of the joining layer 130 according to the first embodiment as illustrated in FIG. 8, and an opening 141 for forming a sealed space S is provided at a position overlapping with an oscillating portion 114 in a plan view in the direction Z. The intermediate member 140 is provided with a flow path groove 142 that is coupled to the opening 141 and a communication hole 123 to establish communication between the sealed space S and the external space. The flow path shape of the flow path groove 142 is similar to that in the first embodiment, one end P1 is coupled to the opening 141, the flow path groove 142 extends from the opening 141 to a position P2 on the outer side, is turned substantially all around the oscillating portion 114 so as to surround the oscillating portion 114 along the peripheral edge of the opening 141 from the position P2, and extends up to the other end P3 facing the communication hole 123.

In the embodiment, the intermediate member 140 and the ultrasonic substrate 110 are joined to each other with a first joining layer 150 that is a viscoelastic member. Similarly, the intermediate member 140 and the sealing plate 120 are joined to each other with a second joining layer 160 that is a viscoelastic member. As the first joining layer 150 and the second joining layer 160, a resist resin or the like that can easily be patterned can be used similarly to the first embodiment.

The first joining layer 150 and the second joining layer 160 preferably have lower rigidity than that of the intermediate member 140. By causing the first joining layer 150 and the second joining layer 160 to absorbing a stress, it is possible to curb a disadvantage that deformation remains due to a stress exceeding an elasticity limit being applied to the intermediate member 140.

In the ultrasonic device 10A according to the embodiment as described above, the intermediate member 140 with lower rigidity than that of the ultrasonic substrate 110 and the sealing plate 120 is provided between the ultrasonic substrate 110 and the sealing plate 120 and the flow path groove 142 that establishes communication between the sealed space S and the external space is provided at the intermediate member 140. Therefore, since the communication portion is not provided at the sealing plate 120 similarly to the first embodiment in the ultrasonic device 10A according to the embodiment, it is possible to enhance the strength of the sealing plate 120. Also, it is possible to absorb a stress with the first joining layer 150 and the second joining layer 160 when the stress is applied and to thereby curb breakage of the ultrasonic substrate 110 and the sealing plate 120.

In the embodiment, the ultrasonic substrate 110 and the intermediate member 140 are joined to each other with the first joining layer 150 that is a viscoelastic member, and the sealing plate 120 and the intermediate member 140 are joined to each other with the second joining layer 160 that is a viscoelastic member. With such a configuration, an intermediate member, the viscosity of which is not high, may be selected as the intermediate member 140 that forms the flow path groove 142, and it is possible to enhance a degree of freedom in design.

Third Embodiment

Next, a third embodiment will be described.

The first embodiment and the second embodiment described above are configured such that the flow path grooves 132 and 142 are coupled to the communication hole 123 provided in the sealing plate 120. In this case, since the configuration in which the through-hole is provided in the sealing plate 120 is employed, the strength of the sealing plate 120 is slightly degraded.

Meanwhile, the third embodiment is different from the first embodiment and the second embodiment in that the communication hole 123 is no provided in the sealing plate 120.

Figure 9:
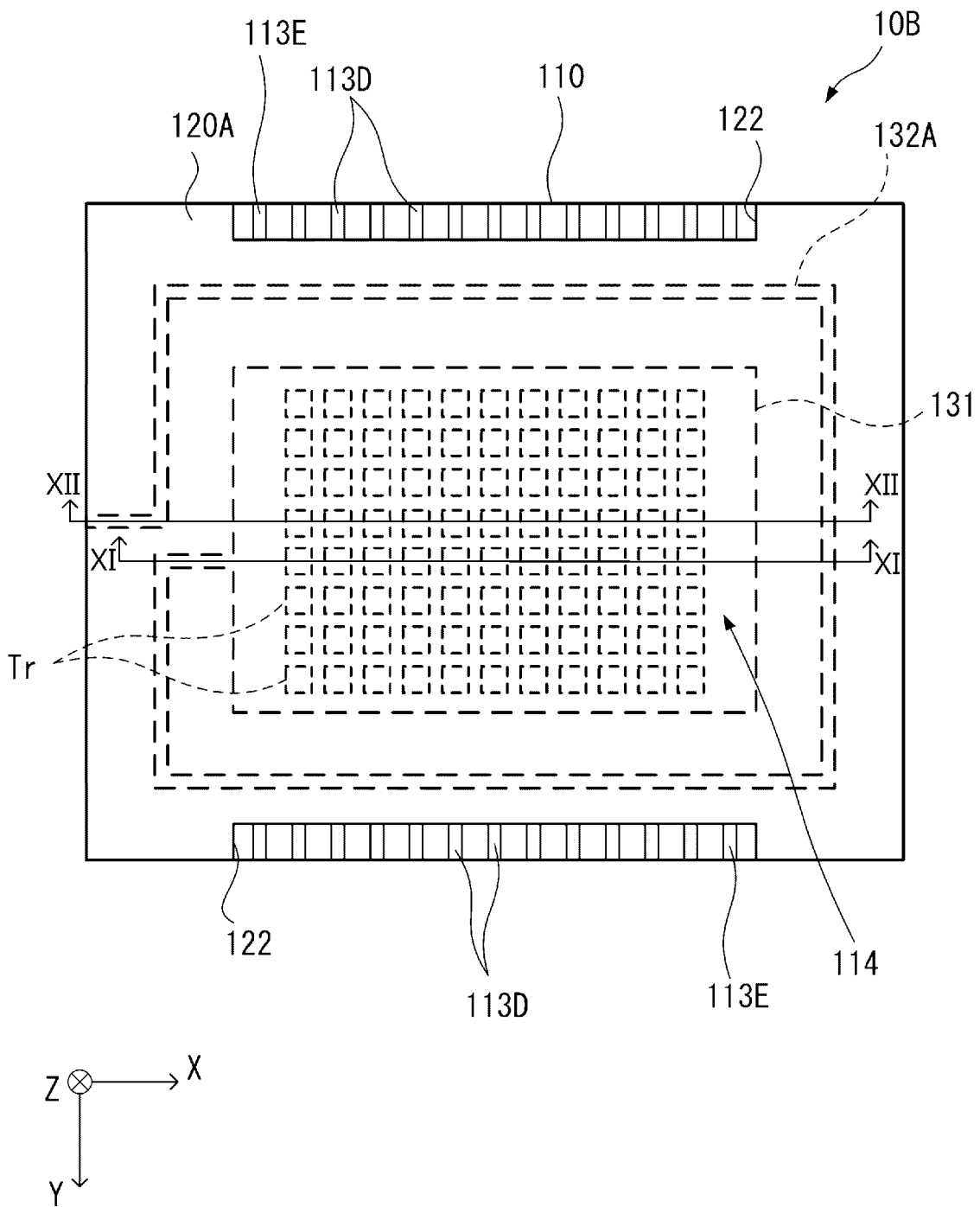
FIG. 9 is an outline plan view illustrating an ultrasonic device according to a third embodiment.
Figure 10:
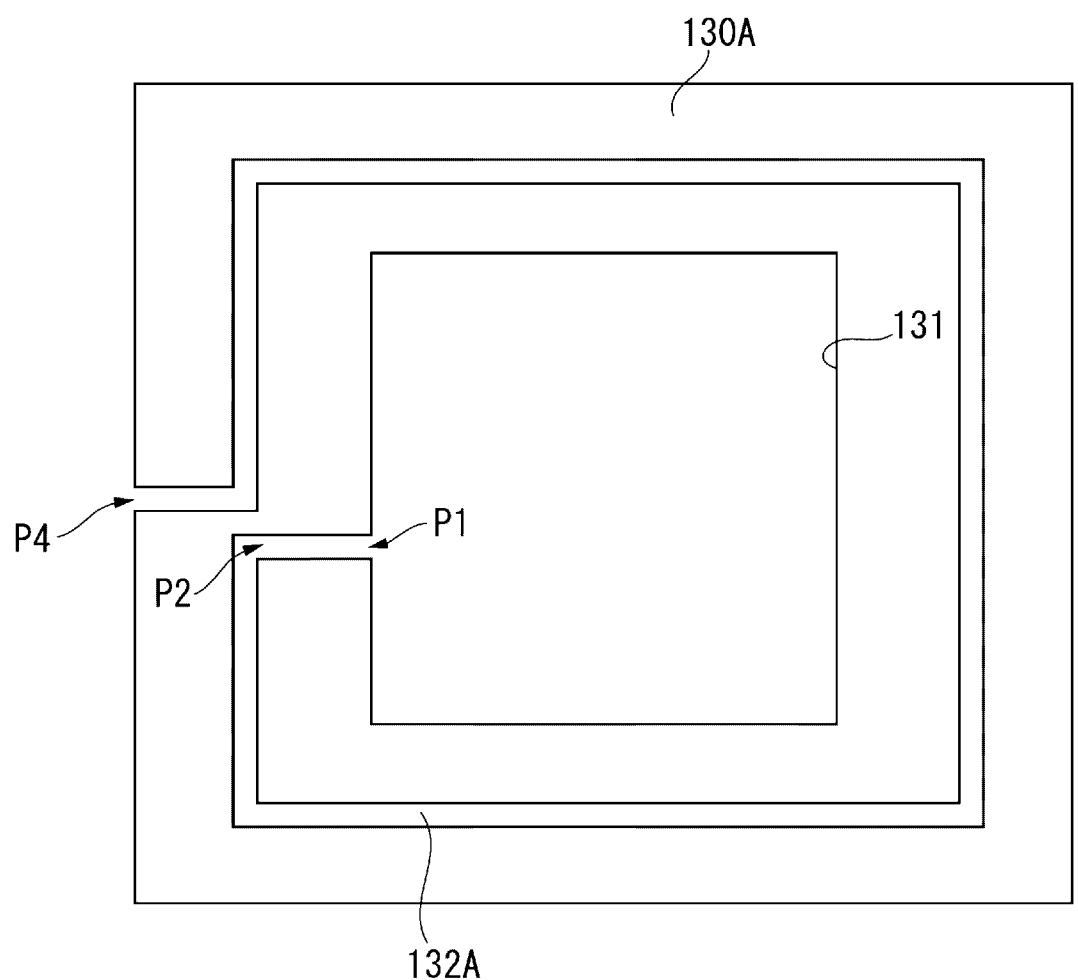
FIG. 10 is an outline plan view illustrating a joining layer according to the third embodiment.
Figure 11:
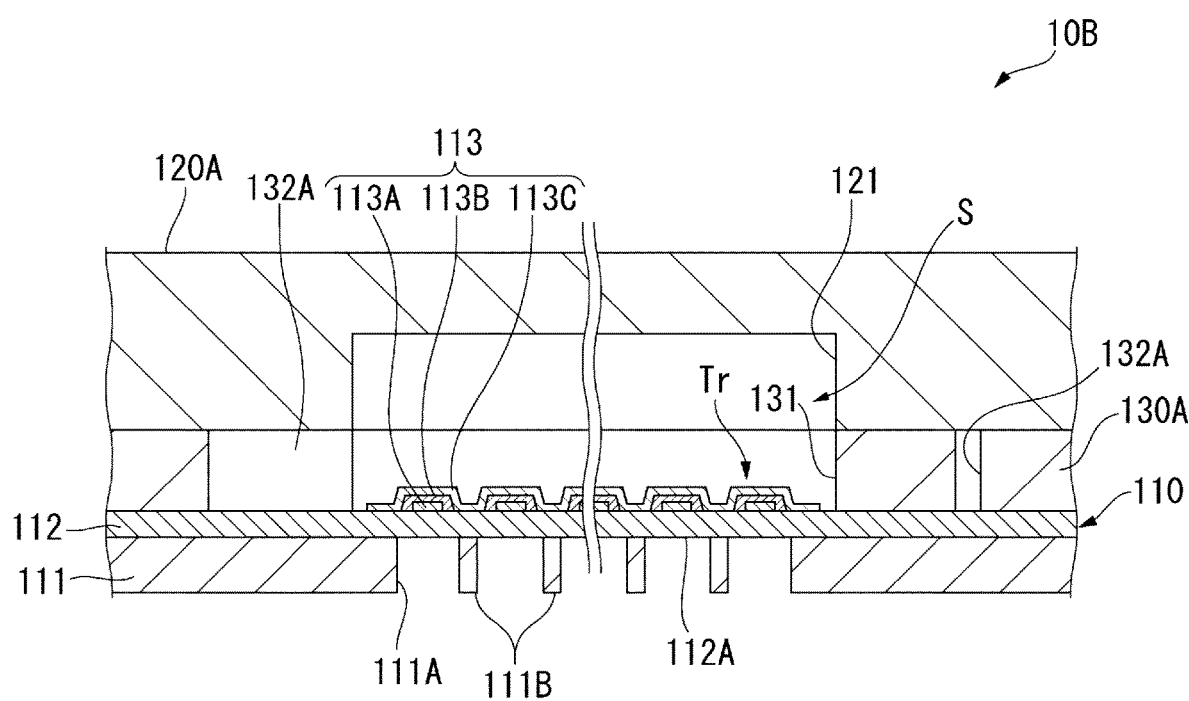
FIG. 11 is a sectional view when the ultrasonic device is cut along the line XI-XI in FIG. 9.
Figure 12:
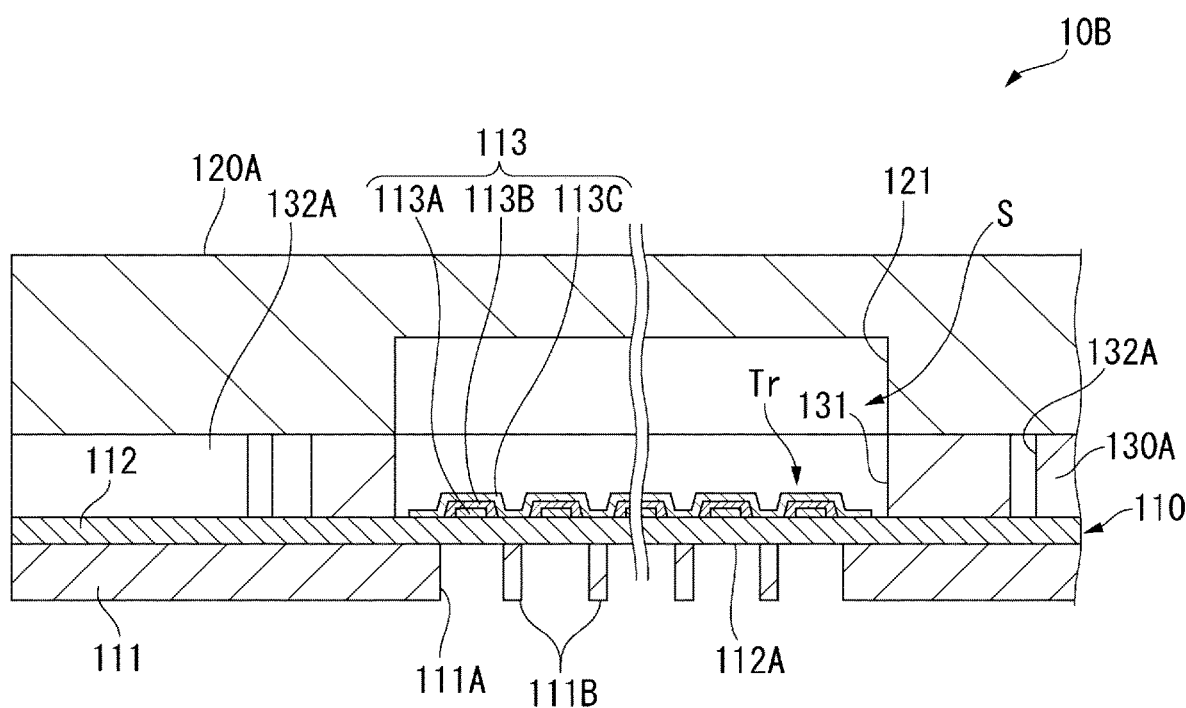
FIG. 12 is a sectional view when the ultrasonic device is cut along the line XII-XII in FIG. 9.

FIG. 9 is an outline plan view of an ultrasonic device 10B according to the embodiment, and FIG. 10 is an outline plan view of a joining layer 130A of the ultrasonic device 10B. FIG. 11 is a sectional view when the ultrasonic device 10B in FIG. 9 is cut along the line XI-XI, and FIG. 12 is a sectional view when the ultrasonic device 10B in FIG. 9 is cut along the line XII-XII.

In the embodiment, the ultrasonic device 10B includes an ultrasonic substrate 110 and a sealing plate 120A, and the ultrasonic substrate 110 and the sealing plate 120A are joined to each other with the joining layer 130A with viscoelasticity similarly to the first embodiment.

Here, no communication hole 123 that penetrates through the sealing plate 120A in the direction Z is provided in the sealing plate 120A in the embodiment as illustrated in FIG. 9.

Also, a flow path groove 132A as illustrated in FIGS. 9 to 12 is provided in the joining layer 130A in the embodiment. The flow path groove 132A is a groove that establishes communication from an opening 131 that configures a sealed space S to an outer edge of the joining layer 130A in a plan view when seen in the direction Z.

In other words, the flow path groove 132A extends from one end P1 coupled to the opening 131 to a position P2 located further outward than the peripheral edge of the opening 131 by a predetermined distance, is turned substantially all around the opening 131 along the peripheral edge of the opening 131 from the position P2, further extends toward the outer peripheral edge of the joining layer 130A, and has the other end P4 communicating with the external space from the outer peripheral edge of the joining layer 130A, as illustrate in FIG. 10.

According to the embodiment as described above, no through-hole is provided in the sealing plate 120A, it is possible to further enhance the strength of the sealing plate 120 and to further curb breakage of the sealing plate 120 when a stress is applied thereto due to an impact or the like.

Note that although the configuration in which the flow path groove 132A that establishes communication from the opening 131 that configures the sealed space S to the outer edge of the joining layer 130A is provided in the joining layer 130A has been exemplified in the aforementioned example, the flow path groove with a similar configuration may be applied to the second embodiment. In other words, the intermediate member 140 in the ultrasonic device 10A according to the second embodiment may be configured to include a flow path groove that establishes communication from the opening 141 that configures the sealed space S to the outer edge of the intermediate member 140 that faces the external space.

Modification Examples

Note that the disclosure is not limited to the aforementioned respective embodiments and modification examples, and configurations achieved by adding modifications or improvements or by appropriately combining the respective embodiments within a range in which the objective of the disclosure can be achieved are also included in the disclosure.

First Modification Example

In the first embodiment and the third embodiment, the flow path groove 132 has been exemplified as the communication portion provided in the joining layer 130, and the example in which the flow path groove 132 is a groove that penetrates from the surface of the joining layer 130 that is joined to the ultrasonic substrate 110 to the surface of the joining layer 130 that is joined to the sealing plate 120 in the direction Z has been described. However, the groove depth of the flow path groove 132 is not limited thereto. For example, the flow path groove 132 may be formed into a recessed groove with a predetermined depth from the surface joined to the ultrasonic substrate 110. Alternatively, the flow path groove 132 may be formed into a recessed groove with a predetermined depth from the surface joined to the sealing plate 120.

The same also applies to the second embodiment, and the flow path groove 142 may be a recessed groove in which either the surface facing the ultrasonic substrate 110 or the surface facing the sealing plate 120 is opened in the intermediate member 140.

Also, the intermediate member 140 may be manufactured by a shaping device such as a 3D printer, and in this case, a pipe-shaped flow path hole may be formed as a communication portion inside the intermediate member 140.

Second Modification Example

In the aforementioned respective embodiments, the configuration in which the flow path grooves 132, 132A, and 142 that are communication portions extend up to a position of a predetermined distance from the opening 131 that forms the sealed space S, are further turned substantially all around the peripheral edge of the oscillating portion 14 in the circumferential direction from the position, and then communicate with the external space have been exemplified.

Meanwhile, the communication portion may have any shape as long as the communication portion is formed such that the flow path length from the sealed space S to the external space becomes long.

Figure 13:
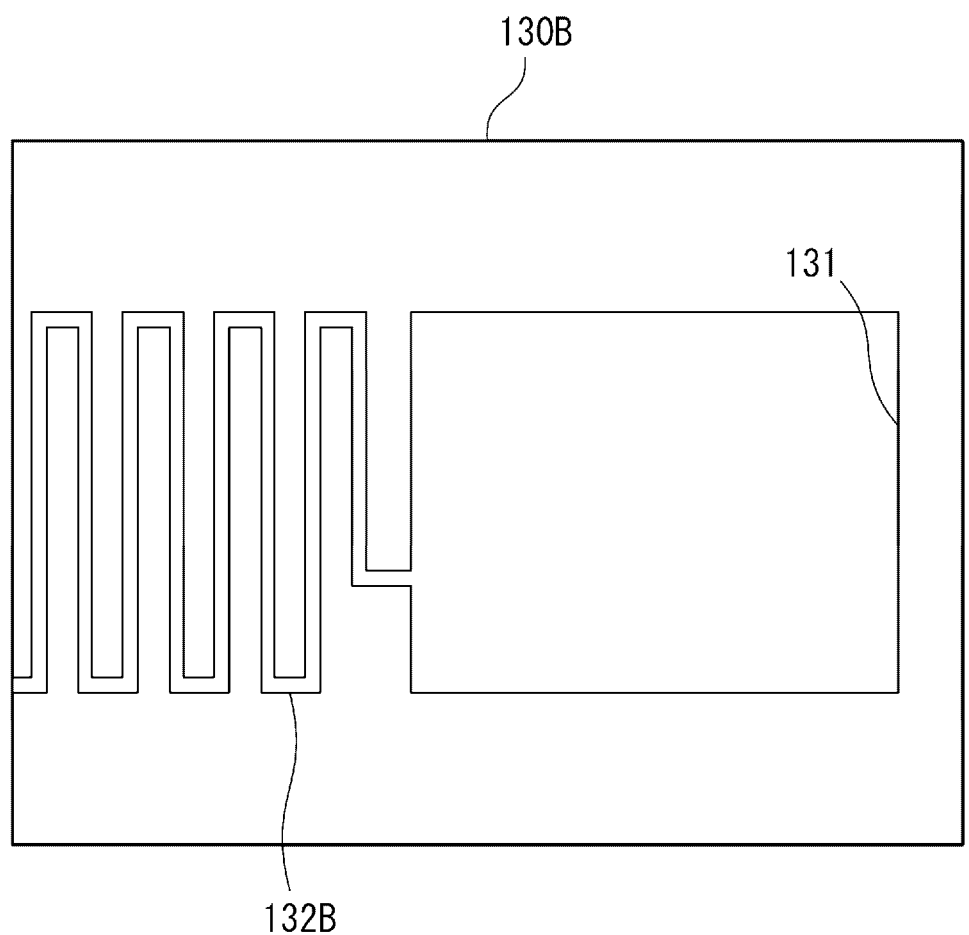
FIG. 13 is a diagram illustrating an example of a joining layer in an ultrasonic device according to a second modification example.

FIG. 13 is a diagram illustrating an example of a joining layer 130B according to the second modification example. As illustrated in FIG. 13, for example, a flow path groove 132B may be formed in a meandering shape from the opening 131 that forms the sealed space S toward the outer peripheral edge of the joining layer 130B. Although FIG. 13 illustrates the example in which the flow path groove 132B is formed in the joining layer 130B, the flow path groove 142 of the intermediate member 140 as described in the second embodiment may be formed into a meandering shape as illustrated in FIG. 13.

As described in the first modification example, the flow path hole may be formed into a 3D structure when the intermediate member 140 is formed using a 3D printer and an annular flow path hole is provided as the communication portion.

Figure 14:
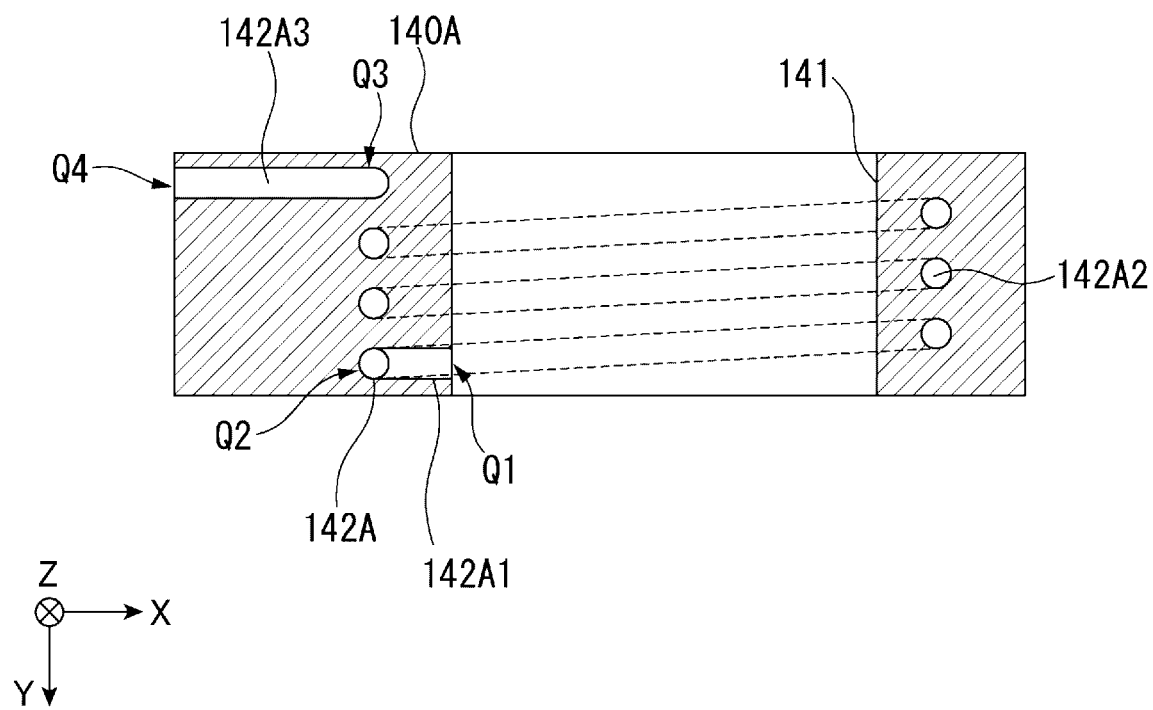
FIG. 14 is a diagram illustrating an example of an intermediate member according to the second modification example.

FIG. 14 is a diagram illustrating an example of an intermediate member 140A according to the second modification example.

As illustrated in FIG. 14, for example, the intermediate member 140A includes an opening 141 that forms the sealed space S and a flow path hole 142A including a coupling portion 142A1, a spiral portion 142A2, and an external communication portion 142A3. The coupling portion 142A1 is a part extending from a coupling end Q1 coupled to the opening 141 to a position Q2 located outward away from the opening 141 by a predetermined distance. The spiral portion 142A2 is a part that extends from the position Q2 to a position Q3 in a spiral shape along the peripheral direction of the opening 141. The external communication portion 142A3 is a part that extends from the position Q3 to a position Q4 at an outer circumference of the intermediate member 140A and communicates with the external space. According to such a flow path hole 142A, it is possible to further elongate the flow path length and to further curb invasion of foreign matters into the sealed space S.

Third Modification Example

In the aforementioned embodiments, the rigidity of the intermediate member 140 is set to be lower than that of the ultrasonic substrate 110 and the sealing plate 120 by configuring the intermediate member 140 with an elastomer or the like. Meanwhile, a configuration in which a plurality of holes are formed inside the intermediate member 140 in a sponge shape to set the rigidity of the intermediate member 140 to be lower than that of the ultrasonic substrate 110 and the sealing plate 120 may also be employed.

Fourth Modification Example

Although the ultrasonic transducers Tr aligned in one array in the direction Y configures one channel CH on the ultrasonic substrate 110 in the first embodiment, a plurality of ultrasonic transducers Tr aligned in the direction X and the direction Y may configure a channel CH, for example.

Also, although a plurality of channels CH are disposed in the direction X, a configuration in which a plurality of channels CH are disposed in the direction Y may also be employed, or a configuration in which a plurality of channels CH are disposed in the direction X and the direction Y may also be employed.

Further, although the example in which the plurality of ultrasonic transducers Tr configure one channel CH has been described, a configuration in which each of the plurality of ultrasonic transducers Tr can be independently driven may also be employed.

Fifth Modification Example

Although the configuration in which the ultrasonic substrate 110 is configured to include the substrate main body 111 that has the holes 111A, the oscillating plate 112 that blocks the holes 111A, and the piezoelectric elements 113 disposed at the blocking portions 112A of the oscillating plate 112 is described in the aforementioned respective embodiments, the disclosure is not limited thereto.

For example, the ultrasonic substrate may be configured to include a substrate, an oscillating film disposed to face the substrate via an air gap, a lower electrode disposed at a position on the substrate facing the oscillating film, and an upper electrode disposed at a position of the oscillating film facing the lower electrode. In this case, the upper electrode and the lower electrode configure an electrostatic actuator, and it is possible to cause the oscillating film to oscillate and output ultrasonic waves by applying a periodic drive voltage to the electrostatic actuator.

Sixth Modification Example

Although the ultrasonic device 10 that performs at least either transmission or reception of ultrasonic waves has been exemplified as the MEMS device in the aforementioned embodiments, the disclosure is not limited thereto.

For example, a driving device that causes a nozzle provided at a pressure chamber to eject a liquid stored in the pressure chamber can be exemplified as the MEMS device. In such a driving device, it is possible to use the same drive substrate as the ultrasonic substrate 110 described above in the aforementioned respective embodiments as the first member. In other words, the drive substrate includes a substrate main body with a hole, an oscillating plate that blocks the hole, and a piezoelectric element disposed at a blocked portion of the oscillating plate. Also, the driving device is disposed such that the substrate main body on the side opposite to the oscillating plate faces the inside of the pressure chamber.

In this case, the ultrasonic transducers Tr in the aforementioned respective embodiments function as ejection elements that cause the liquid to be ejected. In other words, it is possible to raise the pressure in the pressure chamber and to cause the nozzle to eject the liquid by applying a voltage to the piezoelectric element. It is possible to control ejection of liquids from a plurality of chambers by disposing the driving device such that the respective channels face mutually different pressure chambers. Such a driving device can suitably be applied to an ink head of an ink jet printer, for example.

What is claimed is:

1. A MEMS device comprising:
   a first member;
   a second member forming a sealed space with the first member therebetween; and
   a third member disposed between the first member and the second member and joined to the first member and the second member, wherein
   the third member has lower rigidity than rigidity of the first member and the second member,
   the third member is provided with a communication portion that establishes communication between the sealed space and an external space,
   the communication portion is between the first member and the second member,
   the communication portion includes, in sequence, a first section extending in a first direction, a second section extending in a second direction and a third section extending in a third direction, with the second section between the first section and the third section,
   the first direction, the second direction and the third direction are parallel with a plane of the first member, and
   the third direction is opposite to and parallel with the first direction.

2. The MEMS device according to claim 1, wherein
   the first member and the third member are joined with a viscoelastic member, and
   the second member and the third member is joined with a viscoelastic member.

3. The MEMS device according to claim 1, wherein
   the third member has viscoelasticity and is joined to the first member and the second member.

4. The MEMS device according to claim 3, wherein
   the third member is a resist resin.

5. The MEMS device according to claim 1, wherein
   the first member is a substrate including an oscillating portion and performing at least either transmission or reception of ultrasonic waves through oscillation of the oscillating portion, and
   the second member is a reinforcing plate reinforcing the substrate.

6. The MEMS device according to claim 5, wherein
   the third member is provided to surround a circumference of the oscillating portion, and
   the communication portion is disposed along an outer circumference of the oscillating portion.

7. An electronic device comprising:
   the MEMS device according to claim 1; and
   a control unit controlling the MEMS device.

* * * * *